US005130550A

United States Patent [19]

Nakamura et al.

[11] Patent Number: 5,130,550

[45] Date of Patent: Jul. 14, 1992

[54] ELECTRON BEAM LITHOGRAPHY APPARATUS HAVING DEVICE FOR CORRECTING BEAM SHAPE

[75] Inventors: Kazumitsu Nakamura; Hideyuki Kakiuchi, both of Katsuta, Japan

[73] Assignee: Hitachi, Ltd., Tokyo, Japan

[21] Appl. No.: 599,019

[22] Filed: Oct. 17, 1990

[30] Foreign Application Priority Data

Oct. 23, 1989 [JP] Japan .................................. 1-275711

[51] Int. Cl.$^5$ ............................................ H01J 37/304

[52] U.S. Cl. ............................. 250/492.2; 219/121.25

[58] Field of Search ........... 250/492.2, 492.22, 492.23, 250/396 R; 219/121.25, 212.27

[56] References Cited

U.S. PATENT DOCUMENTS

| | | | |
|---|---|---|---|
| 4,145,597 | 3/1979 | Yasuda | 250/492.2 |
| 4,243,866 | 1/1981 | Pfeiffer et al. | 250/492.2 |
| 4,258,265 | 3/1981 | Sumi | 250/492.2 |
| 4,825,033 | 4/1989 | Beasley | 250/492.2 |
| 4,914,304 | 4/1990 | Koyama | 250/492.2 |
| 4,980,567 | 12/1990 | Yasuda et al. | 250/492.2 |

FOREIGN PATENT DOCUMENTS

| | | | |
|---|---|---|---|
| 0105694 | 4/1984 | European Pat. Off. | 250/492.23 |
| 56-32726 | 4/1981 | Japan | 250/492.23 |
| 58-191436 | 8/1983 | Japan | 250/492.23 |

*Primary Examiner*—Janice A. Howell

*Assistant Examiner*—Kiet T. Nguyen

*Attorney, Agent, or Firm*—Antonelli, Terry, Stout & Kraus

[57] ABSTRACT

An electron beam lithography apparatus comprising an upper aperture, a lower aperture, a deflector disposed between the upper aperture and the lower aperture, an optical lens for converging the electron beam passed through the lower aperture onto a specimen, and means for measuring an electron reflected from a position mark installed on a stage when the electron beam scans the position mark, calculating a correction value of the section and the measured reflectional electron and controlling the deflector according to the correction value. As the shapes of the electron beam are corrected by detecting the reflectional electron from the position mark and measuring the positional error of the sectional shape of the electron beam corresponding to the set sectional shapes, the sectional shapes are corrected in high accuracy.

7 Claims, 5 Drawing Sheets

8'
4
8
10
9

STRENGTH OF REFLECTIVE ELECTRON
BEAM SIZE
90%
10%
TIME

DIFFERENTIAL STRENGTH OF REFLECTIVE ELECTRON
50%
BEAM SIZE
TIME

DIFFERENTIAL STRENGTH OF REFLECTIVE ELECTRON
4μm
TIME
2μm
1μm
0.5μm

TABLE W
0.323
TABLE ΔH
0
TABLE ΔW
0.025
TABLE H
0.2
(μm)
0.025
0.05
0.075
0.1
6.400
1
2
3
4
5
6
7
8
256
11
11'
5-1
5-2
5-1'
5-2'

TABLE H
0.85
1
24
256
TABLE ΔW
-0.05
1
4
64
TABLE ΔH
0.05
1
2
5
64
TABLE W
0.75
1
2
3
4
20
256
11'
5-1'
5-2'
5-2
5-1
11

ELECTRON BEAM LITHOGRAPHY APPARATUS HAVING DEVICE FOR CORRECTING BEAM SHAPE

BACKGROUND OF THE INVENTION

The present invention relates to an electron beam lithography apparatus having a device for correcting a sectional shape of the beam and more particularly to the electron beam lithography apparatus having the device for correcting the sectional shape with high accuracy so as to draw lithographic pattern with high accuracy.

In the general electron beam lithography apparatus, the beam shape is approximated with straight lines by calculating maximum and minimum values of the sectional shape of the electron beam. The Japanese published Patent No. 57-59661 is cited as an example of such apparatus.

But, the electron beam lithography apparatus in such a prior art designed by approximating with straight lines may not be used for writing on the wafer with the electron beam having a small section size such as 0.5 μm of each side thereof. If designed by approximating with straight lines, it is impossible to obtain an electron beam shaped with high accuracy.

SUMMARY OF THE INVENTION

The present invention has been accomplished to overcome the above mentioned problem of the conventional technique.

An object of the present invention is to provide an electron beam lithography apparatus which can obtain an electron beam shaped with high accuracy.

In order to attain the above object, plural sectional shapes of an electron beam are set, sectional differences between the set sectional shapes and detected sectional shapes are measured by detecting reflectional electrons from a position mark when the position mark on a stage which mounts a specimen is scanned with the electron beam, and the differences are stored in a data table corresponding to the set sectional shapes and the shapes of the electron beam are controlled so as to correct based on sectional differences according to the set sectional shapes.

In the present invention, as the shapes of the electron beam are corrected by detecting the reflection electron from the position mark and the current density of the electron beam so as to correct the sectional shape of the electron beam corresponding to the set sectional shapes, the sectional shapes are corrected with high accuracy, and an electron beam lithography apparatus having a good linearity of the sectional shape of the electron beam is obtained.

DETAILED DESCRIPTION OF THE PREFERRED EMBODIMENTS

Figure 1A:
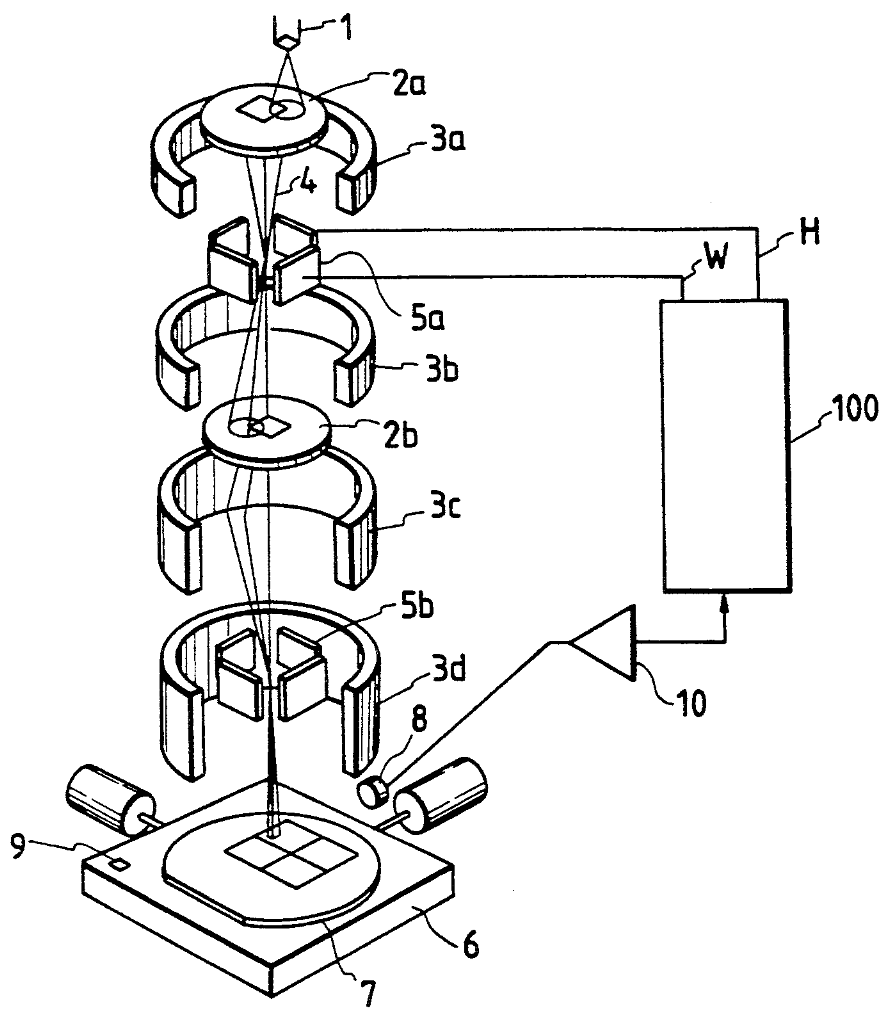
FIG. 1(A) and FIG. 1(B) are diagrammatic view showing an embodiment of a total construction of an electron beam lithography apparatus in the present invention.

An embodiment showing a total construction of an electron beam lithography apparatus in the present invention will be explained and illustrated in FIG. 1.

In FIG. 1, numeral 1 is an electron gun; 2a and 2b denote shaping apertures; 3a, 3b, 3c and 3d denote electronic lenses; 4 denotes an electron beam; 5a and 5b denote deflectors; 6 denotes a stage; 7 denotes a wafer mounted on the stage 6; 8, 8' denote detectors for detecting electrons reflected from the wafer 7 or a standard position mark 9 on the stage 6, and 100 denotes a computer.

Figure 1B:
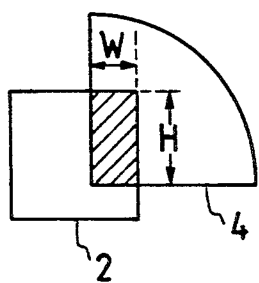

The electron beam 4 from the electric gun 1 is irradiated onto the aperture 2a and pass through the deflector 5a so as to reach the aperture 2b thereunder. The electron beam 4 on the aperture 2b is shaped by the aperture 2a so as to make a rectangular form hatched as in FIG. 1(B). The electron beam 4 having the hatched form shown in FIG. 1(B) is reduced by the reducing lens 3C so as to be irradiated onto a certain position on the wafer 7 which is previously positioned by the deflector 5b and the stage 6.

The electron beam 4 is controlled by the deflector 51 so as to vary the irradiated position of the electron beam 4 on the aperture 2b and to shape a desired rectangular sectional form of the electron beam 4 which passes through the aperture 2b. On the stage 6, the standard position mark 9 is installed for observing the sectional form of the electron beam 4.

The technical feature of the present invention is in correcting the sectional shape of the electron beam by using the standard position mark 9 and correcting method of the sectional shape will be explained using FIGS. 2 and 3 as follows.

Figure 2:
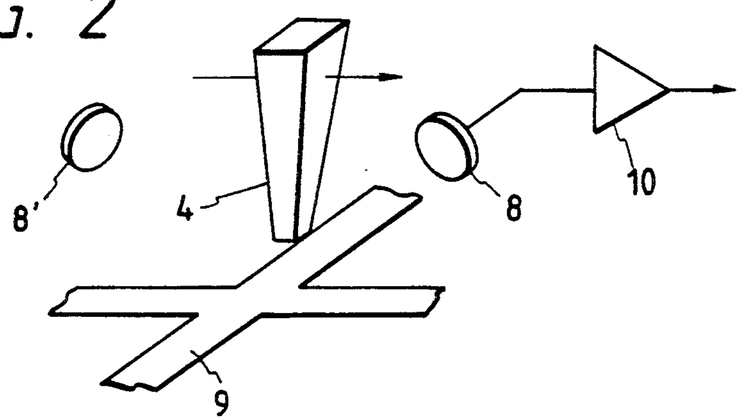
FIG. 2 is a diagrammatic view showing a scanning of a position mark in the present invention shown in FIG. 1.

The standard position mark 9 is made of metal such as gold which is different from a base plate of the mark and is shaped into a gold cross as shown in FIG. 2 and is scanned by the electron beam 4 so as to generate reflective electrons which are detected by the reflective electron detectors 8, 8'. The detected reflective electrons are amplified by the amplifier 10, and the strength signal of the reflective electron is measured as shown in FIG. 3(A).

Figure 3A:
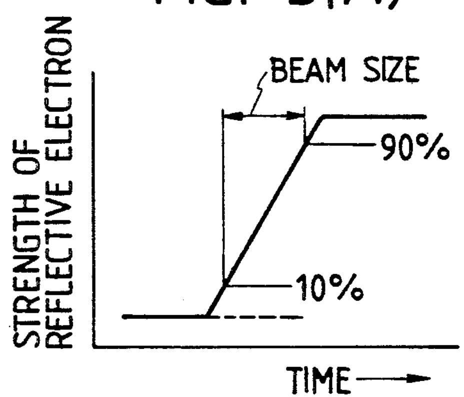
FIGS. 3(A), 3(B), 3(C) is a schematic diagram showing a measuring method of the sectional size of the electron beam in the present invention.

A oblique part of the strength signal line of the reflective electron shown in FIG. 3(A) corresponds to a sectional length of the electron beam 4 in the scanning direction. The smaller the sectional length of the electron beam 4, the greater becomes an inclination of the oblique part, and a scanning time which is equivalent to 10 to 90 percentage of the oblique part corresponds to a beam size of the electron beam in the scanning direction.

Figure 3B:
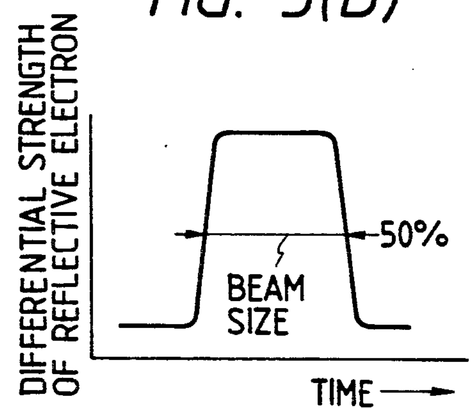
Figure 3C:
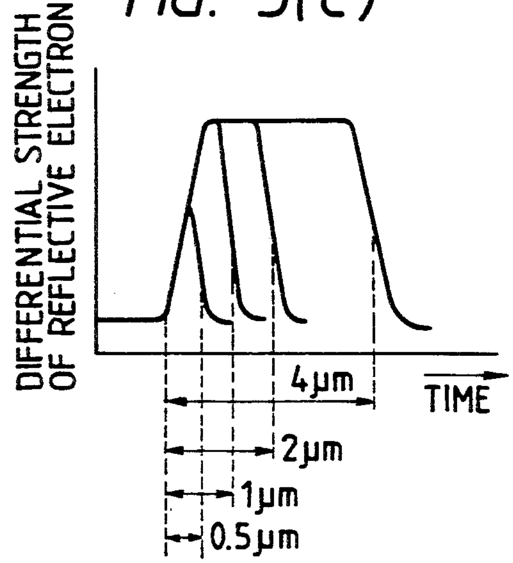

FIG. 3(B) is obtained by differentiating the strength signal line of the reflective electron shown in FIG. 3(A), and 50 percentage height of the peak of the differential strength in FIG. 3(B) is corresponds to the sectional beam size of the electron beam having a rectangular section. Therefore, the correction values of the electron beams are obtained by calculating the 50 percentage height of the peak in the differential strength of the reflective electrons detected when the standard position mark is scanned by the electron beams which are set up the beam sizes thereof to various value. That is to say, scanning the mark 9 with the rectangular electron beams which the beam size is respectively varied the beam size to the various values as stated above. The curve of the differential strength shown in FIG. 3(B) is varied as shown in FIG. 3(C) according to the various values of the beam size and the beam sizes 0.5 μm, 1 μm, 2 μm, 4 μm of the rectangular electron beams 4 in the scanning direction are obtained by measuring the time of the width of the curve with high accuracy.

Figure 4:
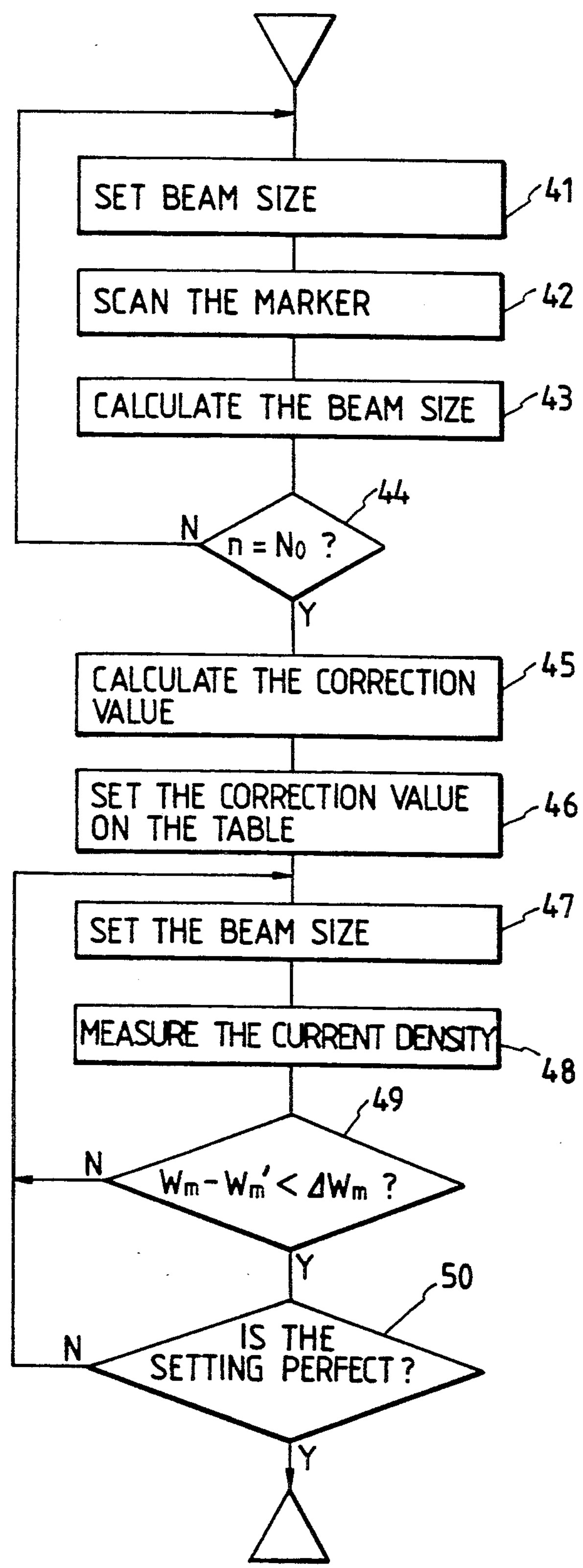
FIG. 4 shows a flow chart of the program executed by a computer 100 shown in FIG. 1 in the present invention.

The detailed embodiment of the calculating method based on measuring of the width of the curve will be explained using FIGS. 4, 5 and 6. FIG. 4 illustrates software executed by the computer 100 and the beam size of the rectangular electron beam are set up to the widths $W_1$, $W_2$, $W_3$, $W_4$, $W_5$, $W_6$ and the heights $h_1$, $h_2$, $h_3$, $h_4$, $h_5$, $h_6$ respectively corresponding to the heights (step 41). After setting up the beam size to a certain width and height as stated above, the standard position mark 9 is scanned by the electron beam 4 which is set up to the certain width and height (step 42). And the reflective electrons are measured by the detector 8, and the beam size of the electron beam 4 is calculated from the differential strength of the reflective electron based on the relation as shown in FIGS. 3(A), 3(B) and 3(C) (Step 43). The calculation stated above is repeated predetermined times (Step 44). At this time, corrected widths $W_1$, $W_2$, $W_3$ and heights $H_1$, $H_2$, $H_3$ which are calculated based on the detected reflective electron are obtained by following equations.

$$W_1 = aw_2 + bh_1 + c \quad (1)$$

$$W_2 = aw_2 + bh_2 + c \quad (2)$$

$$W_3 = aw_3 + bh_3 + c \quad (3)$$

$$H_1 = dw_4 + bh_4 + f \quad (4)$$

$$H_2 = dw_5 + eh_5 + f \quad (5)$$

$$H_3 = dw_6 + eh_6 + f \quad (6)$$

In the above equation, a, b, c are respectively correction coefficients corresponding the widths $W_1$, $W_2$, $W_3$, and d, e, f are correction coefficients corresponding to the height $H_1$, $H_2$, $H_3$. On an experimentation performed by the inventors of the present invention, the following coefficients are obtained.

$a = 0.9$
$b = 0.1$
$c = 0.3$
$d = -0.1$
$e = 1.1$
$f = 0.2$

From these data, the corrected width W and height H based on setting width w and height h are obtained by following equations.

$$W = 0.9w + 0.1h + 0.3 \quad (7)$$

$$H = -0.1w + 1.1h + 0.2 \quad (8)$$

Figure 5:
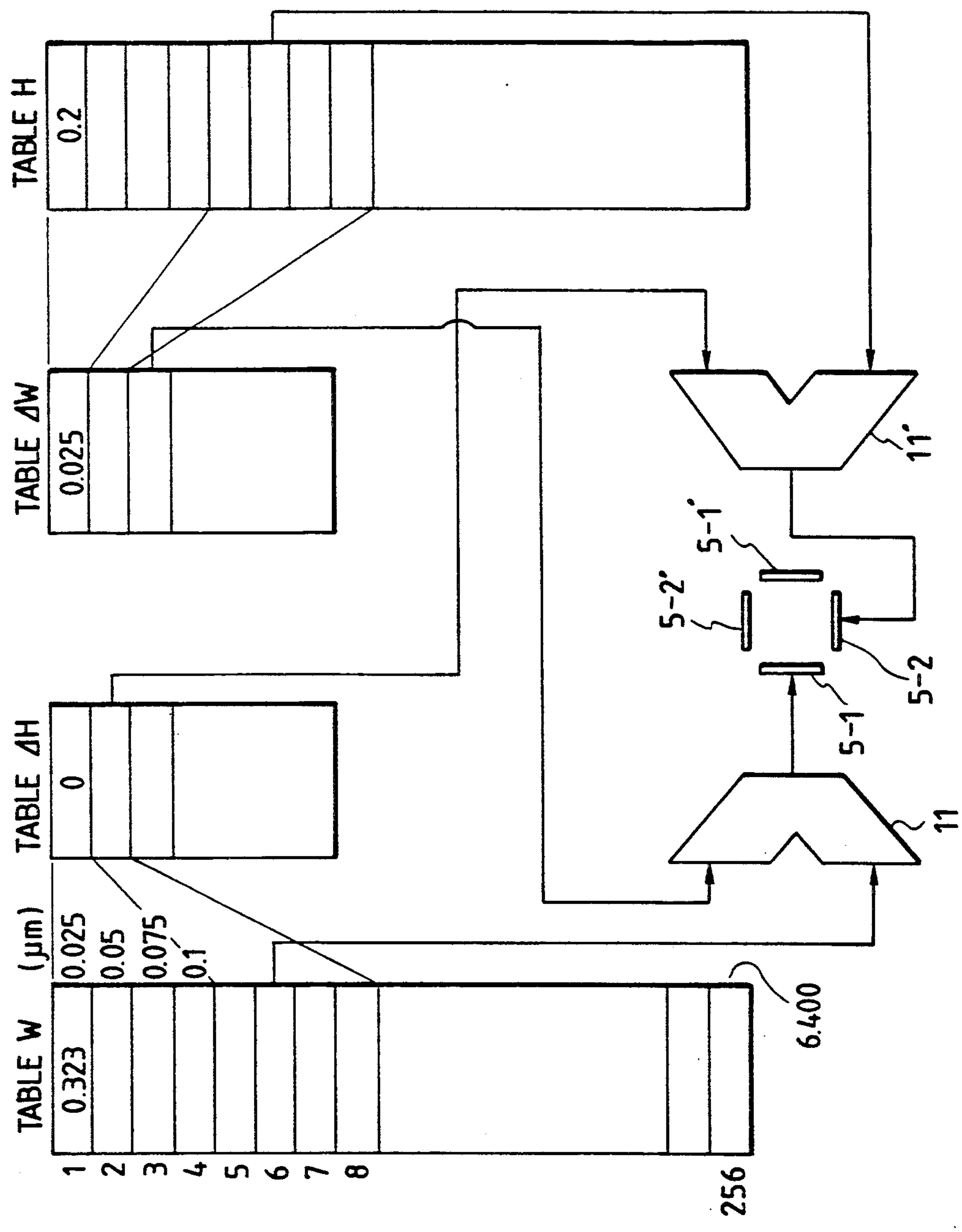
FIGS. 5 and 6 show data tables which memorize the positional error of the sectional shape of the electron beam corresponding to the set sectional shapes in the present invention.

Based on the equations (7) and (8), the width W and height H which are stepwisely changed by every 0.025 μm units are calculated (Step 45), and the calculated values are set up to the data tables shown in FIG. 5 as the correction values (Step 46). FIG. 5 shows a data table W and a data table H which respectively store correction values of the width and the height calculated in 0.025 μm unit as stated above, and 11 denotes an adder and 5-1, 5-2 denote the deflectors of the electron beam.

As w is 0.025 μm at first in the data table W, the corrected width W is obtained based on the equations (7) as follows;

$$W = 0.9 \times 0.025 + 0.3 = 0.323$$

In the data table W, 0.323 is memorized corresponding to the setting value w=0.025 μm. In the data table ΔH, the calculation concerning a variable h of the equation (7) is performed so as to be memorized in the data table ΔH as follows;

$\Delta H = 0.1 \times 0.025 = 0$ (At this time, 0.0025 becomes 0 by rule of counting fractions of 0.025 and over as a unit and cutting away the rest.)

In the same way with respect to the data table H, the corrected height H is obtained corresponding to H=0.025 μm based on the equation (8) as follows;

$$H = -0.1 \times 0.025 + 0.2 = 0.2$$

$$W = 1.1 \times 0.025 = 0.025$$

These values 0.2 and 0.025 are respectively memorized in the data tables H and ΔW.

Using FIG. 6, the data tables of the correction values in the case which the width w is 0.5 μm and the height h is 0.6 μm will be explained. In FIG. 6, 11, 11' denote adders, and 5-1, 5-1', 5-2, 5-2' denote electrodes of the deflector 5a in FIG. 1(A).

Figure 6:
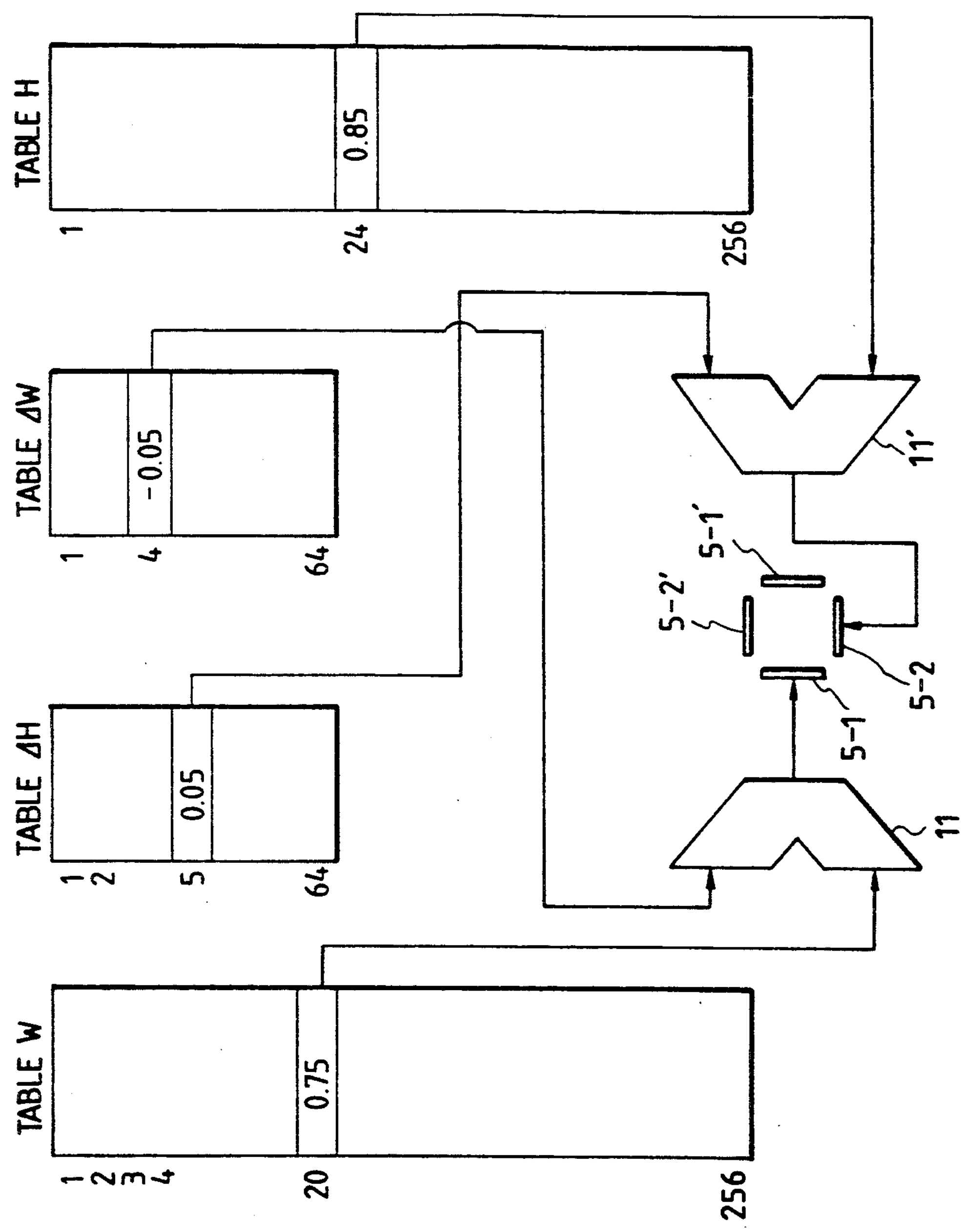

In the FIG. 6, the following correction value of the width is calculated and memorized in the address 20 of the data table W.

$$W = 0.9 \times 0.5 + 0.3 = 0.75$$

In the address 6 of the data table ΔH, the following correction value is memorized.

$\Delta H = 0.1 \times 0.6 = 0.05$ (based on the rule of counting fractions of 0.025 and over as a unit and cutting away the rest.)

In the same way, in the address 24 of the data table H and the address ΔW, following equations are memorized.

$$H = 1.1 \times 0.6 + 0.2 = 0.85$$

$$\Delta W = -0.1 \times 0.5 = -0.05$$

In this way, as the shape of the electron beam which is set as the width w and the height h is corrected its setting is obtained as the width W+ΔW and the height H+ΔH is obtained by using the data tables W, ΔW, H, ΔH and by adding with the adder 11. And the deflector 5a having electrodes 5-1, 5-1', 5-2, 5-2' deflect the electron beam based on the setting of the width W+ΔW and the height H+ΔH and therefore, the shape of the electron beam is controlled with very high accuracy.

Furthermore, in the present invention, as the current density of the electron beam has a tendency as being decreased when the beam size is less than 0.5 μm, the current is corrected so as not to be decreased. That is to say, the beam size of the electron beam is controlled by the deflector which is set up based on the correction value in the data tables (Step 47), and the electron beam is scanned on the wafer and the current density of the electron beam is measured by a some suitable method which in generally known (Step 48).

For example, when the width size of the electron beam is Wn and Wn+1, the current densities are measured as In, In+1. In this case, the correction value Wm' of the value Wm which interpolates Wn and Wn+1 is obtained based on the following equation from the computer 100.

$$Wm' = Wn + (In+1 - In)(Wm - Wn)/In \quad (9)$$

These calculations as stated above are repeated till the errors Wm' − Wn become to be less than certain value ΔWm.

Furthermore in the present invention, the data tables stated above may be corrected with the sum of correction values in the data table W and the data table H.

We claim:

1. An electron beam lithography apparatus comprising:

an upper aperture for shaping a sectional size of an electron beam which passes through the upper aperture from an optical source;

a lower aperture through which the electron beam passes from the upper aperture;

a deflector for deflecting the electron beam so as to control the sectional size of the electron beam as it is being shaped by the upper aperture and the lower aperture, said deflector being disposed between the upper aperture and the lower aperture;

an optical lens for focussing the electron beam which passes through the lower aperture onto a specimen; and means for correcting the sectional size of the electron beam including means for measuring electrons obtained from a position mark mounted on a stage which carries the specimen while the electron beam scans the position mark to generate a measurement corresponding to the sectional size of the electron beam, calculating a first correction value of the sectional size from the measurement, correcting the sectional size of the electron beam using the first correction value, measuring the current density of the electron beam which was corrected by the first correction value, calculating a second correction value from the measured current density and controlling the deflector according to the second correction value.

2. An electron beam lithography apparatus as defined in claim 1, wherein said correcting means further includes means for storing width data of the sectional size and height data of the sectional size in a width data table and a height data table, respectively.

3. An electron beam lithography apparatus as defined in claim 1, wherein the electrons obtained from the position mark are secondary electrons reflected from the position mark.

4. An electron beam lithography apparatus, comprising:

an upper aperture for shaping a sectional size of an electron beam through which the electron beam from an optical source passes;

a lower aperture through which the electron beam from the upper aperture passes;

a deflector for deflecting the electron beam so as to control the sectional size which is shaped by the upper aperture and the lower aperture, said deflector being disposed between the upper aperture and the lower aperture;

an optical lens for focusing the electron beam passed through the lower aperture onto a specimen; and means for correcting the sectional size of the electron beam including means for setting the sectional size of the electron beam, scanning a position mark with the electron beam, calculating a first corrected sectional size by measuring reflected electrons obtained from the position mark, measuring the current density of an electron beam of the first corrected sectional size, calculating a second corrected sectional size from said current density and controlling the deflector based on the second corrected sectional size.

5. An electron beam lithography apparatus as defined in claim 4, wherein said correcting means further includes means for storing width data of the sectional size and height data of the sectional size in a width data table and a height data table, respectively.

6. An electron beam lithography apparatus as defined in claim 4, wherein the reflected electrons obtained from the position mark are secondary electrons reflected from the position mark.

7. An electron beam lithography apparatus, comprising:

an upper aperture for shaping a sectional size of an electron beam through which the electron beam from an optical source passes;

a lower aperture through which the electron beam from the upper aperture passes;

a deflector for deflecting the electron beam so as to control the sectional size which is shaped by the upper aperture and the lower aperture, said deflector being disposed between the upper aperture and the lower aperture;

an optical lens for focussing the electron beam passed through the lower aperture onto a specimen; and means for measuring electrons obtained from a position mark mounted on a stage which mounts the specimen while the electron beam scans the position mark to generate a measurement corresponding to the sectional size of the electron beam, calculating a correction value of the sectional size from the measurement and controlling said deflector according to the correction value.

* * * * *